United States Patent [19]
Badenlou

[11] Patent Number: 5,625,283
[45] Date of Patent: Apr. 29, 1997

[54] METHOD AND APPARATUS FOR CALIBRATING AN ARC COUNTER

[75] Inventor: Mahmoud Badenlou, San Diego, Calif.

[73] Assignees: Sony Corporation, Tokyo, Japan; Sony Electronics Inc., Park Ridge, N.J.

[21] Appl. No.: 519,633

[22] Filed: Aug. 25, 1995

[51] Int. Cl.$^6$ .................................... G01R 27/02
[52] U.S. Cl. .......................... 324/74; 324/158.1; 324/601
[58] Field of Search ................ 324/158.1, 73.1, 324/537, 654, 655, 130, 601, 74; 364/487, 571.01; 318/814, 514; 388/824, 807

[56] References Cited

U.S. PATENT DOCUMENTS

| | | | |
|---|---|---|---|
| 558,517 | 4/1896 | Pieper | 388/807 |
| 3,231,808 | 1/1966 | McDaniel | 388/824 |
| 3,571,703 | 3/1971 | Russell | 324/655 |
| 3,588,611 | 6/1971 | Lambden | 317/31 |
| 4,008,426 | 2/1977 | Ogura | 388/824 |
| 4,283,678 | 8/1981 | Halter | 324/140 R |
| 4,454,557 | 6/1984 | Hurley | 361/93 |
| 4,553,091 | 11/1985 | Bristol | 324/74 |
| 4,734,640 | 3/1988 | Kitahori et al. | 324/127 |
| 4,749,907 | 6/1988 | Boatwright et al. | 324/74 |
| 4,899,103 | 2/1990 | Katzenstein | 324/99 D |
| 4,972,153 | 11/1990 | Zucker et al. | 324/537 |
| 5,185,685 | 2/1993 | Tennies et al. | 361/45 |
| 5,189,375 | 2/1993 | Tuttle | 324/537 |
| 5,512,832 | 4/1996 | Russell et al. | 324/522 |

OTHER PUBLICATIONS

Harry Mileaf; "Electricity One–Seven"; 1966; p. 3–62.

*Primary Examiner*—Vinh P. Nguyen
*Attorney, Agent, or Firm*—Limbach & Limbach LLP

[57] ABSTRACT

A method and apparatus for calibrating a CRT arc counter or other current triggered device having a bifilar wound core and circuitry for causing a predetermined current pulse train to run through said core. Each pulse in the current pulse train creates an electromagnetic field around the core. A probe of the arc counter or other current triggered device is positioned within the electromagnetic field of the core so as to detect it. The calibration apparatus is provided with a switch which can attenuate the current pulses through the core by a predetermined amount. The sensitivity of the device under calibration is adjusted so as to be triggered by the unattenuated pulses and not triggered by the attenuated pulses.

16 Claims, 3 Drawing Sheets

METHOD AND APPARATUS FOR CALIBRATING AN ARC COUNTER

FIELD OF THE INVENTION

The invention pertains to a method and apparatus for calibrating a device which is triggered by the detection of a predetermined minimum current. More particularly, the invention pertains to a method and apparatus for calibrating a CRT arcing counter.

BACKGROUND OF THE INVENTION

As is well known to those skilled in the related arts, one of the primary components of a cathode ray tube (CRT) display apparatus is the electron gun or guns. In particular, a visual display is created on a phosphorescent screen by a CRT by scanning one or more electron beams across the screen to illuminate picture elements (pixels) on the screen in a pattern to create a desired image. A monochrome CRT typically comprises a single electron gun. A color CRT typically comprises three electron guns corresponding to the colors red, green and blue. The combination of the three primary colors in different ratios on any given pixel can create any color in the visible spectrum.

Typically CRTs are manufactured in a clean room environment. Even the slightest contamination by dust or other particles in the neck assembly (which houses the electron gun or guns and the space through which the electron beam or beams travel from the gun to the screen) may significantly affect operation of the CRT. Particularly, if a dust particle or other particle is struck by an electron beam in the neck of a CRT, it typically would cause the CRT to arc, causing a current surge in the CRT. The particular lead or leads on which the current surge would occur depends on a number of factors, such as the particular electron beam which struck the particle. The surge, however, would most likely occur on the focus leads and/or ground leads of the electron guns. If the current surge is great enough, it can burn out one or more of the electronic components of the CRT.

Even if an arcing event does not destroy or harm electronic components, it can cause the calibration of the electron gun or guns to be changed. For instance, in a color monitor, the three electron guns are calibrated relative to each other to create the desired color balance. If these guns are calibrated while a dust particle is in the electron path of one of the guns, they will be calibrated relative to each other to certain values. If a dust particle which existed in the electron path when the initial calibrations were made is later zapped (burned by the electron beam), the initial calibration may no longer be valid. For instance, if the red electron gun was adjusted to 40.2 volts in order to create the desired color balance, and a dust particle in its electron beam path is zapped, the 40.2 volts adjustment may no longer be valid and the display may become skewed toward the red end of the color spectrum.

Arcing, leading to operational failure of the CRT or at least color skew, is one of the more common field failure mechanisms for CRTs.

Most CRT manufactures have quality assurance tests which test the CRT for many possible defects, including the existence of particles in the electron beam path, which cause or may cause arcing or other field failures. It is known that as the number of arcing events occurring during manufacturing and/or testing increases, the more likely the unit is to continue arcing in the field. Such behavior is presumed to be due to the existence of dust or other particles in the CRT which are zapped during manufacturing and/or testing. Excessive arcing during manufacturing or testing, therefore, suggests that the CRT was manufactured under less than perfectly clean conditions. This, in turn, suggests that additional dust particles exist in the neck assembly.

It is possible and even likely that dust particles existing in the neck assembly will may move during transportation, thus not causing arcing until the unit is sold and in operation in the field.

Accordingly, it is desirable to determine how often a CRT arcs during the manufacturing and/or quality assurance testing of the unit. Although, during manufacturing and testing, a CRT unit may typically be powered up and operating for approximately four hours (during which time arcing can occur), most of this time is spent outside of the presence of a person who can actually observe the arcing. For instance, during manufacturing, a CRT is typically "burned" in an aging tunnel for at least an hour. In the burning process, a CRT unit is powered up and operated in a high temperature environment in order to stabilize the components, particularly, the aperture grill. The aperture grill affects the alignment of the beams and typically does not stabilize until at least thirty to forty-five minutes of operation. The burning stage is normally conducted outside of the presence of the observation of humans.

U.S. patent application Ser. No. 08/519,511 filed on even date herewith by applicant, and incorporated herein by reference, discloses an apparatus for detecting and counting the number of times a CRT arcs. The disclosed apparatus comprises an inductor comprised of a split ferrite toroid core wound with ten turn wire which can be coupled around the leads of a CRT through which a current spike will run during arcing. Typically, a current spike caused by arcing will run through the focus leads and/or ground leads of the CRT. Accordingly, a probe should be coupled around each of those leads.

Each probe is coupled through level setting circuitry to a current pulse detector which triggers a monostable mode timer each time a current of a predetermined value is induced in the wire wound around the core of the probe. The level setting circuitry includes a variable resistor which is user adjustable to set the predetermined current level (i.e., the sensitivity of the arc counter). A current is induced in the wire wound around the core by the electromagnetic field created by a current spike in the lead around which the probe is positioned.

The output of the timer is fed to a counter which counts the number of arcing events. The counter, in turn, is coupled to a display unit for displaying the number of arcing events detected.

Each probe of the arc counter includes an adjustable resistor for setting a value of the predetermined current which will trigger the monostable mode timer (and thus the counter). This predetermined current value is dictated by the current which runs through the lead to which the probe is electromagnetically coupled. The predetermined current value is set to a value which is less than the current that would be caused to flow in the inductor wire by the current surge in the sensed CRT lead caused by an arcing event, but greater than the current that would be caused to flow in the inductor wire by the current flow in the sensed lead during normal operation of the CRT.

The reader is referred to the aforementioned U.S. application Ser. No. 08/519,511 for a more detailed description of the arc counter discussed above.

Once the desired predetermined current level is determined, the arc counter must be calibrated to it.

Accordingly, it is an object of the present invention to provide a method and apparatus by which an arc counter, such as the arc counter disclosed in U.S. application Ser. No. 08/519,511, can be calibrated.

More broadly, it is an object of the present invention to provide a method and apparatus by which any current detector can be calibrated.

It is a further object of the present invention to provide a method and apparatus by which an arc counter or other current detector can easily be calibrated to a predetermined trigger value with a small margin of error.

SUMMARY OF THE INVENTION

The invention comprises a method and apparatus for calibrating an arc counter or other device which is triggered by a predetermined detected current. The calibrator apparatus comprises an adjustable current source for providing an adjustable current on a wire wound around a core. The apparatus includes a digital display indicating the amount of current supplied thereto. The calibration apparatus is controlled to output a current to the core equal to the minimum current value which it is desired to trigger the device being calibrated (e.g., the arc counter).

The probe of the arc counter is then positioned adjacent the core of the calibration apparatus in order to be within the electromagnetic field created by any current which runs through the core.

When activated, the calibration apparatus outputs a regular current pulse of the preset value on the wire wound around the core. The calibration device includes a two position switch which, in the first position, generates the current pulse of the preset value and, in a second position, generates a current pulse 0.2 amperes less than the preset value.

The sensitivity of the arc counter, should be adjusted so that the counter is triggered (e.g., it counts up a unit) for every current pulse when the switch on the calibration device is in the first position and does not count up for any pulse when the switch on the calibration device is in the second position. This allows the arc counter or other device to be calibrated to the preset current within a margin of error of −0.2 amperes. For example, if the preset current is 1.3 amps, and the arc counter is adjusted as described above, then it is known that the minimum trigger current for the arc counter is set somewhere between 1.1 and 1.3 amps.

DETAILED DESCRIPTION OF A PREFERRED EMBODIMENT OF THE INVENTION

Figure 3:
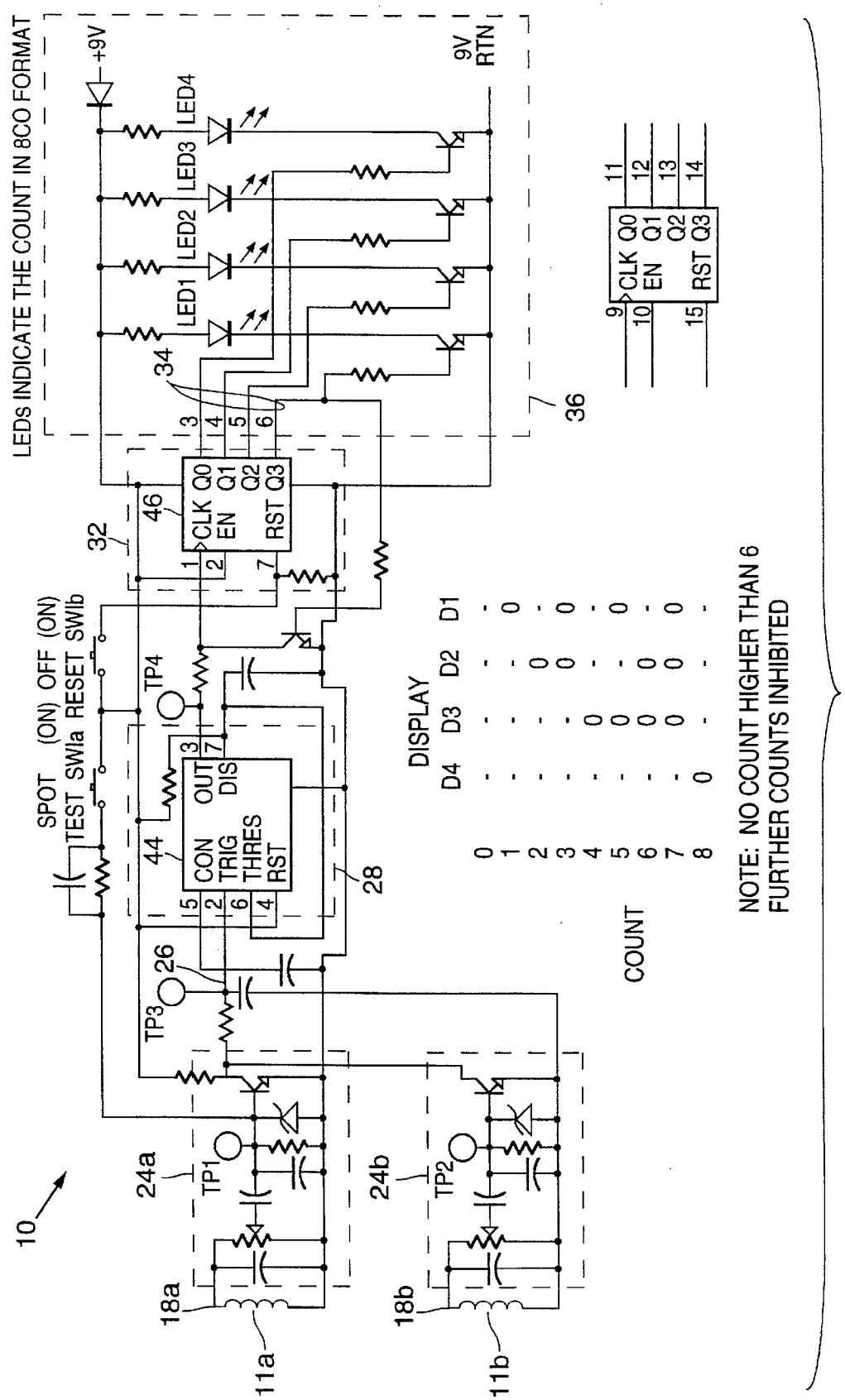
FIG. 3 is a detailed schematic diagram of an arc counter which can be calibrated using the calibration apparatus of the present invention.

As noted above in the background section of this application, the present invention can be adapted and used to calibrate any device which is triggered by a predetermined current. The following description of a preferred embodiment, is directed to a device particularly adapted for calibrating the arc counter which is disclosed in aforementioned U.S. application Ser. 08/519,511. FIG. 3 is a detailed schematic diagram of the arc counter disclosed in that patent application.

Figure 1:
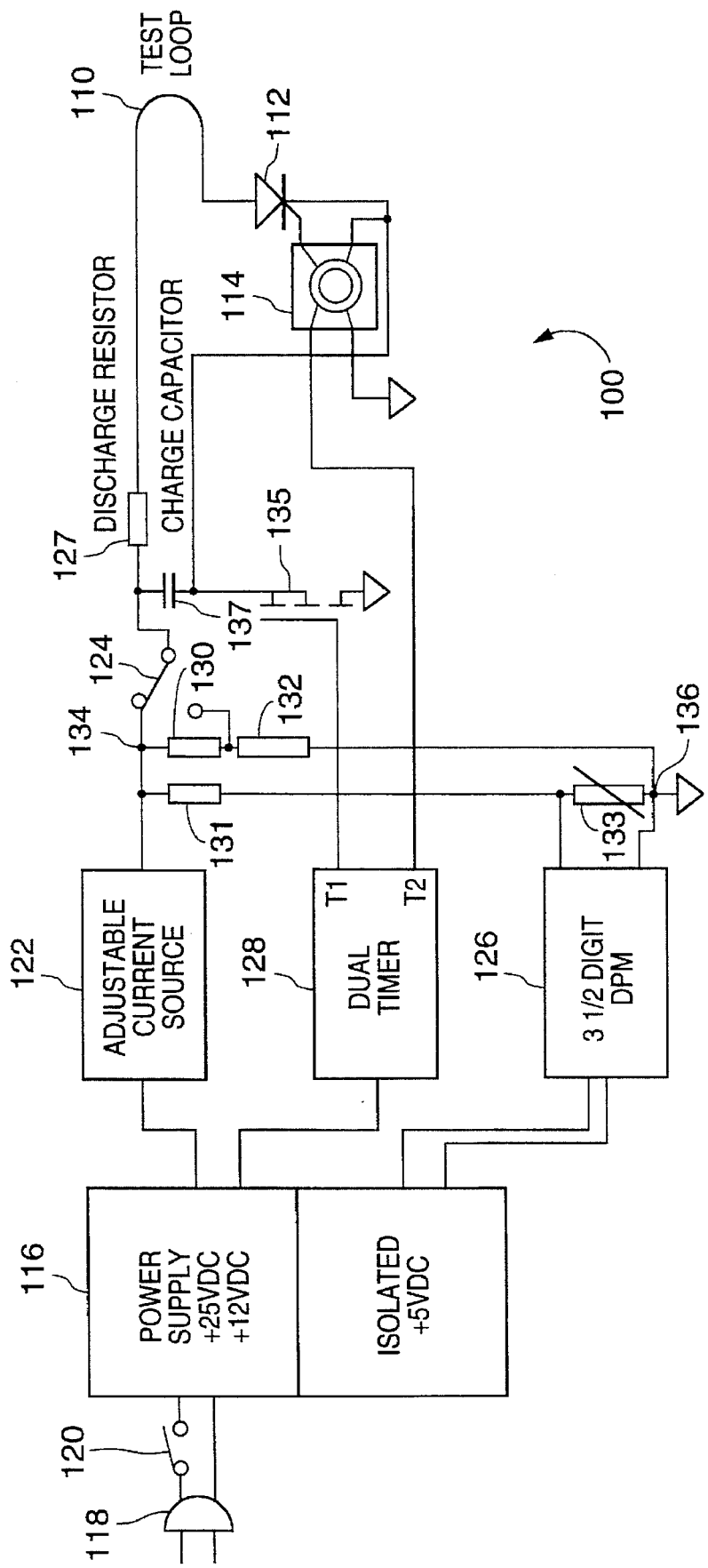
FIG. 1 is a block diagram of the major components of the calibration apparatus of a preferred embodiment of the present invention.

FIG. 1 is a block diagram of an apparatus for calibrating an arc detector according to a preferred embodiment of the invention.

In operation, the calibrator 100 causes a current to flow in test loop 110 which is of a value (amperage) greater than or equal to the minimum current which it is desired to have trigger the arc counter which is being calibrated. That current is supplied through a solenoid control rectifier 112, to an inductor core 114 comprised of a bifilar wound 0.5 inch ferrite toroid core.

During normal arc detecting operation, the lead of the CRT which is being tested for a current spike manifesting an arcing event in the CRT is placed in the middle of the core of the arc counter's probe. During calibration, the probe is used in a similar manner. Specifically, the probe of the arc counter (not shown) which is to be calibrated is positioned within the electromagnetic field of the inductor core in order to sense the electromagnetic field created by the current flowing through the wire wound around the core. Preferably, the core of the arc counter and the core of the calibrator of the present invention are placed immediately adjacent each other, but not in contact. The calibration device has a two tier power supply for providing 25 volts DC and 12 volts DC to the circuitry of the calibrator 100. The power supply is coupled to a 120 volt 60 Hz AC source (such as a standard wall outlet in the United States). An on/off switch 120 alternately opens or closes the connection between the AC source 118 and the internal power supply 116, thus switching the device on or off.

An adjustable current source 122 provides a current through switch 124 and resistor 127 to solenoid control rectifier (SCR) 112. Current source 122 is operator adjustable, preferably by a rotary potentiometer on the cover of the calibrator unit.

A digital display module 126 displays the value of the current in test loop 110 in amperes. Digital display module 126 receives the voltage at the junction of resistors 131 and 133, which is a scaled version of the voltage at node 134, and is adjusted to display the voltage at node 134 as a functions of the voltage at the node of resistors 131 and 133.

The operator adjusts the current source 122 until the display module 126 displays the current to which the sensitivity of the arc counter under calibration is to be set, i.e., the minimum current which should trigger the arc counter to count an arcing event. A dual timer 128 sends out two sets of regular synchronized pulses which alternately turn on and turn off solenoid control rectifier 112 through transistor 135. This, in turn, causes the preset current to flow through the core 114 when the SCR 112 is on and to stop the current flow when the SCR is off. A discharge capacitor 137 accumulates the charge from the current source 122 when the SCR 112 is off. Accordingly, a regular current pulse train of pulses having the value (amperage) indicated by the display module 126 is caused to flow through core 116. As previously noted, this creates an electromagnetic field which is sensed by the probe of the arc counter.

Switch 124 has two positions. In the first position (shown in FIG. 1), the current generated by the current source 122 is provided directly into the test loop (which includes the resistor 127, the SCR 112 and the core 114). When in the second position, an attenuated current from the adjustable current source 122 is provided into the test loop 110 through a current divider (or voltage divider) comprised of resistors 130 and 132.

In a preferred embodiment of the invention, switch 124 is a switch which appears on the cover of the calibration unit 100 which is biased to remain in the first position (shown in FIG. 1) unless and until it is depressed by finger contact to the second position. As soon as the contact is released, the switch returns to the first position. Also in the preferred embodiment of the invention, resistors 130 and 132 of the divider are selected relative to each other so as to provide a 0.2 ampere drop in the current in the test loop between switch position 1 and switch position 2 when the adjustable current source 122 is set to provide 1.3 amps to the test loop. In other words, the resistors 130 and 132 are selected so that approximately 15.4% of the voltage drop from the output node 134 of the adjustable current source and ground 136 occurs through resistor 130 while the remaining approximately 84.6% occurs through resistor 132. This ratio provides a drop in current from 1.3 to 1.1 amperes in the test loop.

The value to which the current source 122 should be set and the ratio of the resistors in the current divider depends on the minimum current value which it is desired to trigger the arc counter under calibration and the accuracy (margin of error) to which that setting must be made, respectively.

FIG. 3 is a detailed schematic diagram of an arc counter 10 in accordance with the present invention. As shown, the unit comprises two probes 11a and 11b. Since the two probes operate identically, only probe 11a will be discussed.

Current sensed by probe 11a will cause current to flow through the wire 18a. That current causes a voltage to appear across resistor R1. As shown, resistor R1 is a variable resistor with one of its terminals coupled to the base of transistor Q1 so that the portion of that voltage drop which appears at the base of transistor Q1 is adjustable. Capacitors C3 and C5 split the voltage drop, preferable in half. Zener diode ZD1 is provided to protect the circuitry of the arc counter 10 from extremely high current surges and, in a preferred embodiment, is a 6.2 volt zener diode.

When a current flows in wire 18a due to a sensed current, it turns on transistor Q1 of current detector 24a. The collector of transistor Q1 is coupled to the trigger terminal of a monostable mode timer 44 of circuit 28. The voltage at the collector of transistor Q1 will go low when transistor Q1 is activated, thus triggering low activated monostable mode timer 44. When triggered, timer 44 outputs a 10 millisecond pulse to the CLK input pin of binary coded decimal (BCD) up counter 46 of counter circuit 32. Each time BCD up counter 46 receives a pulse at its clock input terminal, it increments its BCD output terminals Q0 through Q3. BCD output lines Q0 through Q3 of counter 46 are coupled to a display on the panel of the arc counter which indicate the number of arcing events detected.

To calibrate such an arc counter, the probe 11a of the arc counter which is to be calibrated is placed within the magnetic field of core 114. The calibrator 100 is turned on by plugging it into an outlet 118 and closing switch 120. The operator then observes the display module 126 to determine if the unit is set to the desired current. If not, the operator sets the current accordingly.

Let us assume that the arc counter should be calibrated to detect an arcing event when its probe detects a current greater than 1.3 amperes with an accuracy of minus 0.2 amperes. In other words, a current of 1.3 amps or greater will trigger the arc counter, whereas a current of 1.1 amps or less will not trigger the arc counter. It will not be known whether the arc counter will be triggered by a current between 1.1 and 1.3 amperes.

As discussed more fully below, the larger the margin of error which is acceptable, the more quickly an arc counter can be calibrated by the calibrator of the present invention. Since, arcing in a typical CRT is likely to produce a current much greater than 1.3 amperes while normal operation in a CRT is likely to produce currents only substantially less than 1.1 amps, a margin of error of −0.2 amps is perfectly acceptable and will allow the operator to calibrate the arc counter quickly without making multiple adjustments to obtain an arc counter calibration having an accuracy much greater than needed.

Once the adjustable current source is set to the desired level, e.g., 1.3 amperes in the test loop (when switch 124 is in the rest position shown in FIG. 1), the user observes the display of the counter which is being calibrated. If the counter is not counting up at the interval of the dual timer, the operator turns down the sensitivity of the arc counter until it begins counting at the interval of the dual timer 128. As noted above, this is done by adjusting the value of variable resistor R1 of the arc counter. The variable resistor adjusts the sensitivity of the arc counter, i.e., the current level through probe core L1 which will cause transistor Q1 to become forward biased and, thus, cause the arc counter to count an arcing event.

The operator then depresses switch 124 so as to place it in the second position in which test loop 110 receives only 1.1 amps. If the operator has appropriately adjusted the sensitivity of the arc counter to be triggered by a current somewhere between 1.1 and 1.3 amps, then the counter should stop counting when the switch 124 is depressed. If the operator has over adjusted the sensitivity of the arc counter so that it is now triggered by a voltage less than 1.1 volts, then the counter will continue counting even though switch 124 is depressed.

The operator will then upwardly adjust the sensitivity of the arc counter until it stops counting when switch 124 is depressed. The operator will continue to make adjustments to the sensitivity of the arc counter until a situation is achieved in which the counter counts upward at the interval of dual timer 128 when switch 124 is in the first position and stops counting upwards when switch 124 is depressed into the second position. At that point, it is known that the arc counter is calibrated to a sensitivity between 1.1 and 1.3 amps.

If the device being calibrated must be calibrated to a greater accuracy, then the ratio of resistors 130 and 132 can be altered to make the difference between the current in the test loop when the switch 124 is switched from the first to the second position to the desired error margin.

Figure 2:
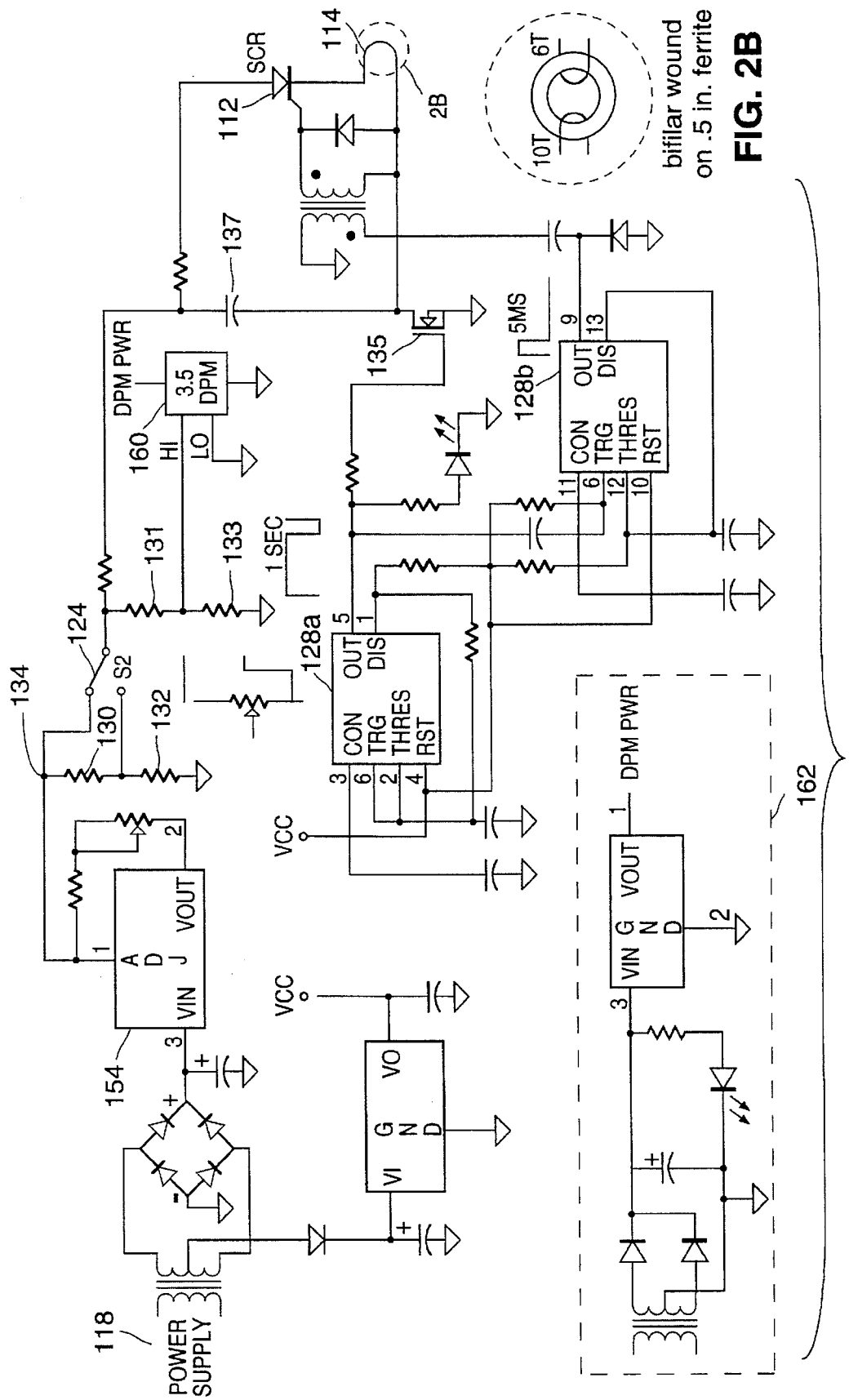
FIG. 2 is a detailed schematic diagram of a preferred embodiment of the present invention.

FIG. 2 is a detailed schematic of a preferred embodiment of the present invention in accordance with FIG. 1 and the description above. Power from AC power supply 118 is converted into a 25 volt DC output by transformer T1 and Wheatstone Bridge rectifier BR1 and supplied to a power regulator 154.

Power regulator 154 along with adjustable resistor R2 and resistor R3 comprises the adjustable current source 122 of FIG. 1. R4 and R5 are resistors 130 and 132 of FIG. 1. The voltage supplied at node 134 is dictated by the setting of adjustable resistor R2. The voltage at node 134 is provided through R13 and R14 to SCR 112. Resistor R14 corresponds to resistor 127 in FIG. 1. When SCR 112 is on, the current produced by the voltage at node 134 is provided through the core 114. When SCR 112 is off, the voltage accumulates on capacitor C10, which corresponds to the capacitor 137 of FIG. 1.

A pair of counters 128a and 128b comprise dual timer 128 of FIG. 1. Counter 128a generates a pulse of one second duration every 1.05 seconds while counter 128*b* generates a pulse of 0.05 seconds duration every 1.05 seconds. The counters 128*a* and 128*b* are synchronized relative to each other such that the 5 millisecond pulse from counter 128*b* appears in between the one second pulses of counter 128*a*. The one second pulse of counter 128*a* activates SCR 112 by turning on transistor Q1. Transistor Q1 corresponds to element 135 in FIG. 1. The 5 millisecond pulse of counter 128*b* turns off SCR 112 through transformer T3. The voltage at node 134 is divided by resistors R6 and R7 and are also supplied to DPM 160. DPM 160 is the display module which is selected and adjusted to display the current level of the calibration unit 100 as a function of the voltage at the junction of resistors R6 and R7 (which is dictated by the voltage at node 134).

The power supply to the DPM 160 is supplied through the circuit 162 shown in FIG. 2.

Having thus described a few particular embodiments of the invention, various alterations, modifications, and improvements will readily occur to those skilled in the art. For instance, the present invention can be used to calibrate any device which is triggered by a specified current level and is not limited to the exemplary arc counter discussed above. Such alterations, modifications and improvements as are made obvious by this disclosure are intended to be part of this description though not expressly stated herein, and are intended to be within the spirit and scope of the invention. Accordingly, the foregoing description is by way of example only, and not limiting. The invention is limited only as defined in the following claims and equivalents thereto.

I claim:

1. An apparatus for calibrating a device for detecting a current of a predetermined value flowing in a wire comprising;

an inductor for generating an electromagnetic field for emulating a current flowing in a wire to be sensed by said device for detecting a current, a current source for supplying a current to said inductor for generating said electromagnetic field, a current divider coupled between said current source and said inductor for selectively providing first and second scaled versions of said current to said inductor, said first current having said predetermined value and said second current having a lesser value, and a switch coupled to said inductor, said switch having a first position in which said inductor is coupled to receive said first current from said current source through said current divider and a second position in which said inductor is coupled to receive said second current from said current source through said current divider.

2. An apparatus as set forth in claim 1 wherein said switch has a first terminal coupled to said inductor, a second terminal coupled directly to said current source and a third terminal coupled to said current divider and wherein said switch is movable between a first position in which said first and second terminals are connected and a second position in which said first and third terminals are connected.

3. An apparatus adapted for calibrating a device for detecting a current pulse of a predetermined value in a wire, said apparatus comprising; an inductor for generating an electromagnetic field for emulating a current flowing in a wire to be sensed by said device for detecting a current, a current source for supplying a current to said inductor for generating said electromagnetic field, a current divider coupled between said current source and said inductor for selectively providing first and second scaled versions of said current to said inductor, a switch coupled to said inductor, said switch having a first position in which said inductor is coupled to receive said first current from said current source through said current divider and a second position in which said inductor is coupled to receive said second current from said current source through said current divider, a solenoid control rectifier coupled between said inductor and said switch for selectively allowing and inhibiting a current from flowing into said inductor, and means for controlling said solenoid control rectifier to alternately allow and inhibit current from flowing into said inductor.

4. An apparatus as set forth in claim 3 wherein said means for controlling said solenoid control rectifier comprises first and second timers for generating first and second current pulse trains, respectively, for alternately turning said solenoid control rectifier on and off, respectively.

5. An apparatus as set forth in claim 4 wherein said inductor comprises a toroidal core wound with ten turn wire and wherein said current is supplied to said ten turn wire to generate said electromagnetic field.

6. An apparatus as set forth in claim 4 further comprising a display for indicating the current flowing in said inductor.

7. A method for calibrating a device for detecting a current of a predetermined value flowing in a wire, said device having a probe for sensing an electromagnetic field created by current flowing in said wire, said method comprising the steps of;

(1) providing an inductor for generating an electromagnetic field for emulating a current flowing in a wire, (2) placing said probe in a position relative to said inductor to sense said electromagnetic field, (3) supplying a reference current of said predetermined value to said inductor to generate said electromagnetic field, (4) determining if said device detected a current of said predetermined value responsive to said reference current, (5) adjusting a sensitivity of said device until said device detects said reference current, (6) adjusting said reference current by an amount equal to a predetermined margin of error to provide an adjusted reference current and supplying said adjusted reference current to said inductor, (7) determining if said device detected a current of said predetermined value responsive to said adjusted reference current, and (8) adjusting said sensitivity of said device until said device detects said reference current and does not detect said adjusted reference current.

8. An apparatus as set forth in claim 7 wherein step (3) comprises the steps of;

(3.1) supplying a current source for supplying said reference current, and (3.2) providing means by which said reference current can be adjusted to said predetermined value.

9. A method as set forth in claim 7 wherein said device is adapted to detect a current spike in a wire and wherein step (3) comprises supplying said reference current in pulses of said predetermined value interrupted by periods of no current.

10. A method as set forth in claim 9 wherein step (6) comprises supplying said adjusted reference current in pulses of said predetermined value interrupted by periods of no current.

11. An apparatus for calibrating, within a predetermined margin of error, a device for detecting a current of a predetermined minimum value flowing in a wire comprising;

an inductor for generating an electromagnetic field for emulating a current flowing in a wire to be detected by said device for detecting a current, a current source for supplying a current to said inductor for generating said electromagnetic field, a current divider coupled between said current source and said inductor for dividing said current from said current source so as to provide first and second reference currents to said inductor, said first reference current being equal to said predetermined minimum value and said second reference current being less than said first reference current by an amount equal to said predetermined margin of error, a switch coupled to between said current divider and said inductor, said switch having a first position in which said inductor is coupled to receive said first reference current and a second position in which said inductor is coupled to receive said second reference current.

12. An apparatus for calibrating, within a predetermined margin of error a device for detecting a current pulse of a predetermined value in a wire, said apparatus comprising;

an inductor for generating an electromagnetic field for emulating a current flowing in a wire, a current source for supplying a current to said inductor for generating said electromagnetic field, a current divider coupled between said current source and said inductor for dividing said current from said current source so as to provide first and second reference currents to said inductor, said first reference current being equal to said predetermined minimum value and said second reference current being less than said first reference current by an amount equal to said predetermined margin of error, a switch coupled between said current divider and said inductor, said switch having a first position in which said inductor is coupled to receive said first reference current and a second position in which said inductor is coupled to receive said second reference current, and pulse means for causing said reference currents supplied to said inductor to comprise trains of current pulses.

13. An apparatus as set forth in claim 12 wherein said pulse means comprises;

a solenoid control rectifier coupled between said inductor and said switch for selectively allowing and inhibiting a current from flowing into said inductor, and means for controlling said solenoid control rectifier to alternately allow and inhibit current from flowing into said inductor.

14. An apparatus as set forth in claim 13 wherein said means for controlling said solenoid control rectifier comprises first and second timers for generating first and second synchronized current pulse trains, respectively, for alternately turning said solenoid control rectifier on and off, respectively.

15. An apparatus as set forth in claim 14 wherein said means for controlling said solenoid control rectifier further comprises a transistor having a control terminal coupled to receive said first pulse train, and a current input terminal coupled to said inductor for turning said inductor on responsive to each pulse in said first pulse train and a transformer having input terminals coupled to receive said second pulse train and output terminals coupled across said inductor for turning said inductor off.

16. An apparatus as set forth in claim 14 further comprising a display for indicating the current flowing in said inductor.

* * * * *